(12) United States Patent
Gandhi

(10) Patent No.: US 11,129,095 B2
(45) Date of Patent: Sep. 21, 2021

(54) CONTROLLER FOR PRECISELY POWERING REMOTE RADIO HEADS ON A CELL TOWER

(71) Applicant: John Mezzalingua Associates, LLC, Liverpool, NY (US)

(72) Inventor: Ronak Bhadresh Gandhi, Syracuse, NY (US)

(73) Assignee: John Mezzalingua Associates, LLC, Liverpool, NY (US)

(*) Notice: Subject to any disclaimer, the term of this patent is extended or adjusted under 35 U.S.C. 154(b) by 26 days.

(21) Appl. No.: 16/622,437

(22) PCT Filed: Jun. 13, 2018

(86) PCT No.: PCT/US2018/037335
§ 371 (c)(1),
(2) Date: Dec. 13, 2019

(87) PCT Pub. No.: WO2018/231984
PCT Pub. Date: Dec. 20, 2018

(65) Prior Publication Data
US 2020/0213940 A1    Jul. 2, 2020

Related U.S. Application Data

(60) Provisional application No. 62/520,302, filed on Jun. 15, 2017.

(51) Int. Cl.
*H04W 52/02* (2009.01)
*G01R 31/40* (2020.01)
*H04W 88/08* (2009.01)

(52) U.S. Cl.
CPC ........ *H04W 52/0206* (2013.01); *G01R 31/40* (2013.01); *H04W 88/085* (2013.01)

(58) Field of Classification Search
CPC ............. H04W 52/0206; H04W 88/085; G01R 31/40; Y02D 30/70
See application file for complete search history.

(56) References Cited

U.S. PATENT DOCUMENTS 9,439,092 B1    9/2016 Chukka et al.
2008/0211583 A1*  9/2008 Nguyen ............... H03F 1/0211
                                                   330/297

(Continued)

OTHER PUBLICATIONS

European Patent Office,Supplementary European Search Report; Appliciation No. 18817965.9/ Patent No. 3639380; based on International Application No. PCT/US2018/037335; dated Feb. 22, 2021; (pp. 8).

(Continued)

*Primary Examiner* — Kenneth T Lam
(74) *Attorney, Agent, or Firm* — Barclay Damon LLP

(57) ABSTRACT

Disclosed is a system and method for providing stable and reliable power to components on the top of a cell tower. The system performs a device discovery process to determine with Power Supply Units are connected to which Remote Radio Heads on the tower. It also provides several ways of characterizing the power cables and input capacitance to the Remote Radio Heads to provide optimal power to the Remote Radio Heads, including situations in which the power demand for the Remote Radio Heads increases, while obviating the need to replace the power cables with those of greater current capacity. Further, the system provides for stable power even in the presence of sensor instabilities and data dropouts.

14 Claims, 8 Drawing Sheets

(56) References Cited

U.S. PATENT DOCUMENTS

| | | |
|---|---|---|
| 2013/0095811 A1 | 4/2013 | Okino |
| 2015/0326317 A1 | 11/2015 | Michaelis et al. |
| 2016/0156199 A1 | 6/2016 | Tsukamoto et al. |
| 2016/0342168 A1 | 11/2016 | Chamberlain et al. |
| 2017/0331326 A1* | 11/2017 | Hanley .................... H04B 3/44 |
| 2018/0164355 A1* | 6/2018 | Winkler ................. G01R 19/25 |
| 2018/0173263 A1* | 6/2018 | Chamberlain .... H04W 52/0206 |
| 2018/0213091 A1* | 7/2018 | Kostakis ................. G05F 1/468 |
| 2018/0337526 A1* | 11/2018 | Al-Mufti .............. H02H 1/0007 |
| 2018/0337705 A1* | 11/2018 | Coleman ............. H04W 88/085 |

OTHER PUBLICATIONS

International Searching Authority, International Search Report and Written Opinion; International Application No. PCT/US2018/037335; dated Oct. 15, 2018; Date of Completion: Oct. 15, 2018 (pp. 12).

International Preliminary Examining Authority, International Preliminary Report on Patentability; International Application No. PCT/US2018/037335; dated Jun. 19, 2019; Date of Completion: Jun. 4, 2019 (pp. 9).

* cited by examiner

CONTROLLER FOR PRECISELY POWERING REMOTE RADIO HEADS ON A CELL TOWER

BACKGROUND OF THE INVENTION

Field of the Invention

The present invention relates to wireless communications, and more particularly, to a system and method for providing precise and robust power to a plurality of Remote Radio Heads (RRHs) mounted on a cell tower.

Background

The increasing sophistication and capabilities of Remote Radio Heads (RRHs) mounted on cell towers has led to greater power demands. In a typical tower installation, each RRH includes several components (e.g., antenna, a plurality of diplexers and filters, and a Remote Electrical Tilt (RET) mechanism), each of which corresponding to a sector. The power supplies for each RRH is located either in a shelter at the base of the tower, or at a location some distance from the base of the tower.

FIG. 1 illustrates a conventional cell tower deployment 100, which includes a tower 110 on which are mounted three Remote Radio Heads 120 (RRH), including RRH1, RRH2, and RRH3. These RRHs 120 receive power from respective Power Supply Units 130 (PSU), which includes PSU1, PSU2, and PSU3. Each PSU provides power to its respective RRH 110 via power cable 140. Power cable 140 may be a hybrid power cable that includes a signal line (not shown) that carries information to/from RRH 120. Each of the PSUs 130 may be housed in a shelter 150, which may be located at the base of tower 110, or may be located a distance from tower 110, whereby the maximum distance is limited by the power losses in hybrid cable 140.

One problem with increasing power demand is that simply increasing the number of power cables 140, or replacing existing power cables 140 with those having increased capacity, can be prohibitively expensive. A solution to this is to increase the capacity of existing power cabling by increasing the voltage at the PSUs 130 and keeping the current relatively constant. This requires precise and stable control of the voltage outputs of the PSUs 130.

Further, conventional solutions to providing power to RRHs 120 involve having a technician set physical addresses on the components, typically with hardware switches integrated into the components. If the technician sets the wrong address, the PSUs 130 may be mismatched to their respective RRHs, leading to improper powering and requiring that a technician return to the top of the tower 110 to correct the address anomaly, which can also be prohibitively expensive.

Finally, there is typically a sensor at the tower-end of the power cable 140, which senses the received voltage, digitizes it, and transmits the sensed voltage back to the respective PSU 130. These sensors, and their respective digitizers, may be affected by extreme environments, both in terms of weather as well as electromagnetic environments. This may affect the stability and performance of the digitizers, whereby the device may transmit spurious data and noisy data to the PSUs 130. This in turn degrades the precision of the voltage that the PSU 130 can provide to the RRHs 120 on the tower.

Accordingly, there is a need for a power supply controller for cell towers, whereby the power supply controller can make optimal use of existing cable infrastructure, can detect anomalies in RRH power reading and configuration settings, and can provide robust and precise power to each RRH in the presence of challenging physical environments.

SUMMARY OF THE INVENTION

An aspect of the present invention is a system for controlling power to a cell tower. The system comprises a plurality of remote radio heads, each of the remote radio heads having a corresponding voltage sensor; a plurality of power supply units; and a controller coupled to the voltage sensors and the plurality of power supply units, wherein the controller is configured to receive a plurality of voltage samples from each of the plurality of voltage sensors, the voltage samples corresponding to power provided by each of the power supply units to a corresponding remote radio head, pre-filter each voltage sample, and issue a voltage command to each of the power supply units, wherein each voltage command corresponds to a pre-filtered voltage sample Another aspect of the present invention is a method for initializing a power system for a cell tower, the power system having a plurality of power supply units coupled to a respective plurality of remote radio heads by a plurality of power cables. The method comprises: a) setting a first power supply unit to a first frequency; b) sending an output pulse at the first frequency; c) measuring a return time for a return pulse corresponding to the output pulse; d) measuring an amplitude of the return pulse; e) repeating steps a)-d) for a plurality of frequencies; f) identifying a matching frequency corresponding to a highest amplitude return pulse; g) calculating a power cable length based on the return time corresponding to the matching frequency; h) calculating a power cable resistance based on the power cable length; and i) calculating an offset voltage based on the power cable resistance.

Another aspect of the present invention is a power system for a cell tower. The power system comprises a plurality of remote radio heads; a plurality of power supply units, each of the power supply units coupled to a respective remote radio head by a powercable; a inductive current sensor coupled to each of the power supply units and its respective power cable; and a controller coupled to the plurality of power supply units and its corresponding inductive current sensor, the controller having a processor and a non-volatile machine-readable memory encoded with instructions for operating in a test mode and an operation mode, wherein the test mode includes setting a series of voltages at each of the plurality of power supply units, measuring a resulting current with a corresponding inductive current sensor and calculating a VI factor corresponding to each voltage and the current, and wherein the operation mode includes setting each of the power supply units to a control voltage in response to a sensed current, wherein the control voltage is a function of the sensed current and a respective VI factor.

And another aspect of the present invention is a method for controlling a power system for a cell tower, the power system having a plurality of power supply units coupled to a respective plurality of remote radio heads by a plurality of power cables. The method comprises receiving a plurality of voltage samples from a plurality of voltage sensors; pre-filtering the plurality of voltage samples, wherein the pre-filtering includes validating each of the plurality of voltage samples: comparing each of the pre-filtered voltage samples to a voltage setpoint; sending a command voltage based on the comparing and storing the command voltage; and receiving and storing a sensed voltage and sensed current from the power supply unit, wherein the sensed voltage and sensed current correspond to the command voltage.

DESCRIPTION OF EXEMPLARY EMBODIMENTS

Figure 1:
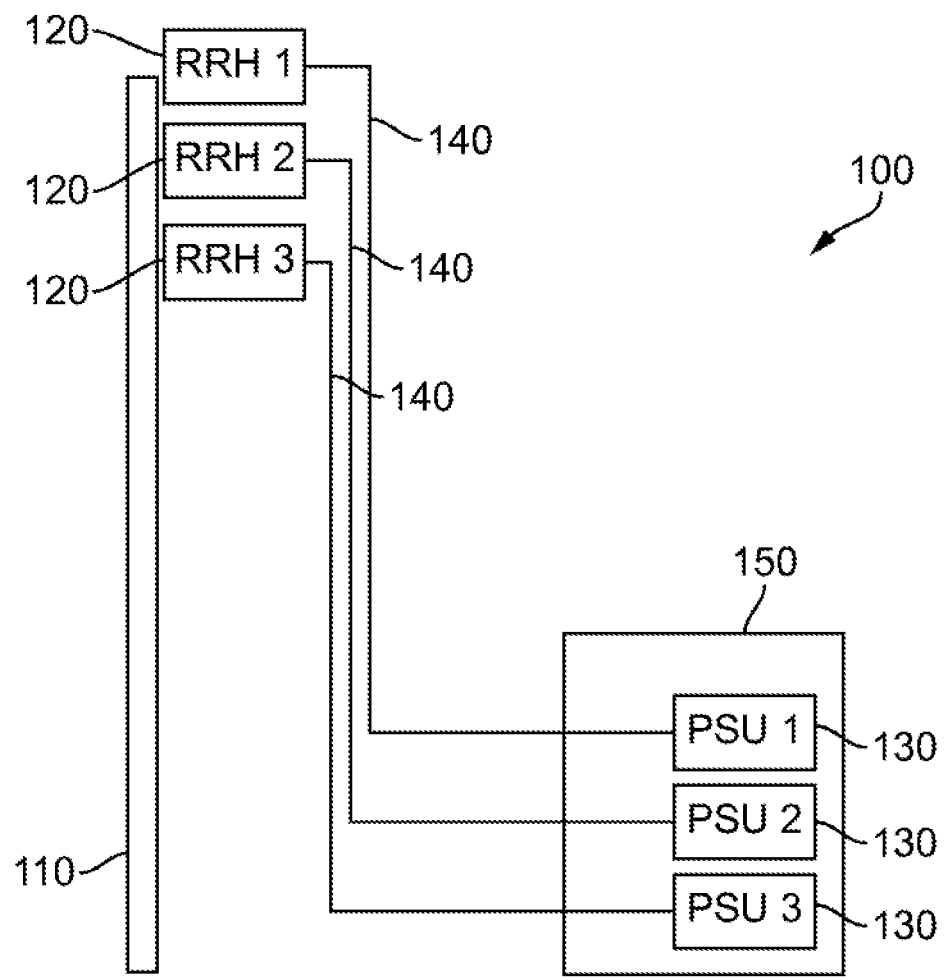
FIG. 1 illustrates a conventional RRH tower deployment.
Figure 2A:
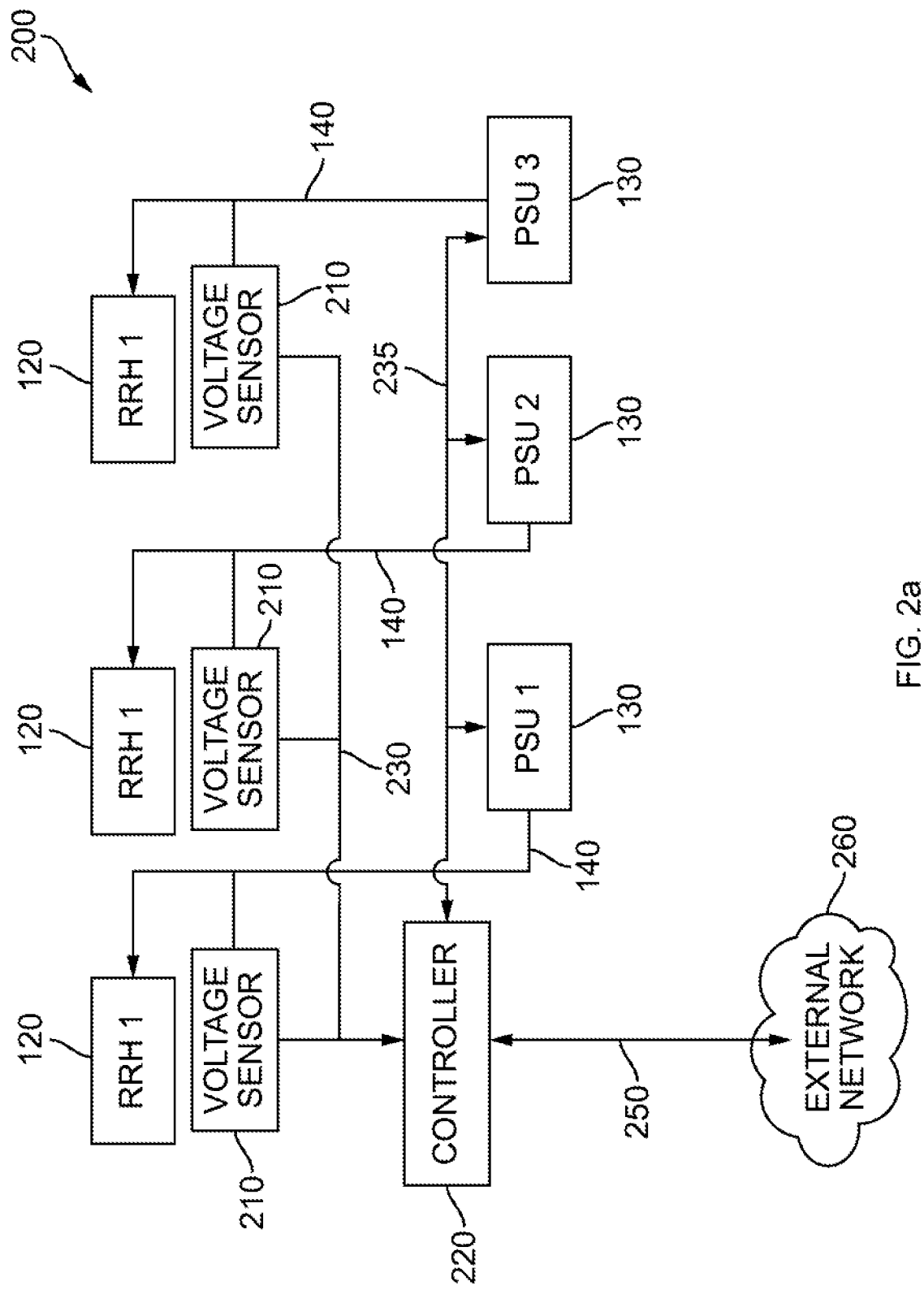
FIG. 2a illustrates an exemplary power control system according to the disclosure.

FIG. 2a illustrates an exemplary system 200 according to the disclosure. System 200 includes a plurality of tower top equipment, which may include Remote Radio Heads (RRHs) 120 and respective Power Supply Units (PSUs) 130, which may be substantially similar to the RRHs 120 and PSUs 130, respectively illustrated in FIG. 1. System 200 further includes a controller 220; a plurality of voltage sensors 210, each of which corresponds to a RRH 120; a sensor data bus 230 that provides data connectivity between voltage sensors 210 and controller 220; a PSU data bus 235 that provides data connectivity between controller 220 and PSUs 130; and power cables 240 that transmit power from PSUs 130 to their respective RRH 120.

Although FIG. 2 illustrates Remote Radio Heads 120 as an example of tower top equipment, other forms of equipment that has requires a consistent voltage and that may consume varying current may be tower top equipment according to the disclosure.

Each RRH 120 may include all the components necessary to operate an antenna for a given sector. These components may include an antenna, one or more diplexers, one or more filters, Tower Mounted Amplifiers (TMA) and a Remote Electrical Tilt (RET) unit. All these components may be powered by a corresponding PSU 130, with the power being transmitted via power cable 140. Power distribution may be provided at the RRH 120 whereby the power delivered via power cable 140 is broken out and distributed to the relevant components.

Voltage sensor 210 measures the voltage at the tower-end of power cable 140. Voltage sensor 210 may be integrated into the power distribution circuitry (not shown) within RRH 120. Alternatively, voltage sensor 120 may be integrated into a connector at the tower-end of cable 140. Further, voltage sensor 120 may be integrated into power cable 140 at any point along the length of power cable 140, which may involve additional functionality that is described below.

An alternative to a voltage sensor 210 may be an inductively coupled sensor, which may be an inductive current sensor and/or an inductive voltage sensor. The inductively coupled sensor(s) may be coupled to a given power cable 140 at the top of the cable (e.g., at the remote radio head 120, at the bottom of the cable (e.g., at the power supply 130), or at both locations.

As illustrated in FIG. 2a, controller 220 is coupled to external network 260 via network connection 250. External network 260 may include the network infrastructure of one or more mobile network operators, through which the network operator(s) may interact with components of system 200, including issuing commands to and receiving data from one or more components of system 200.

Figure 2B:
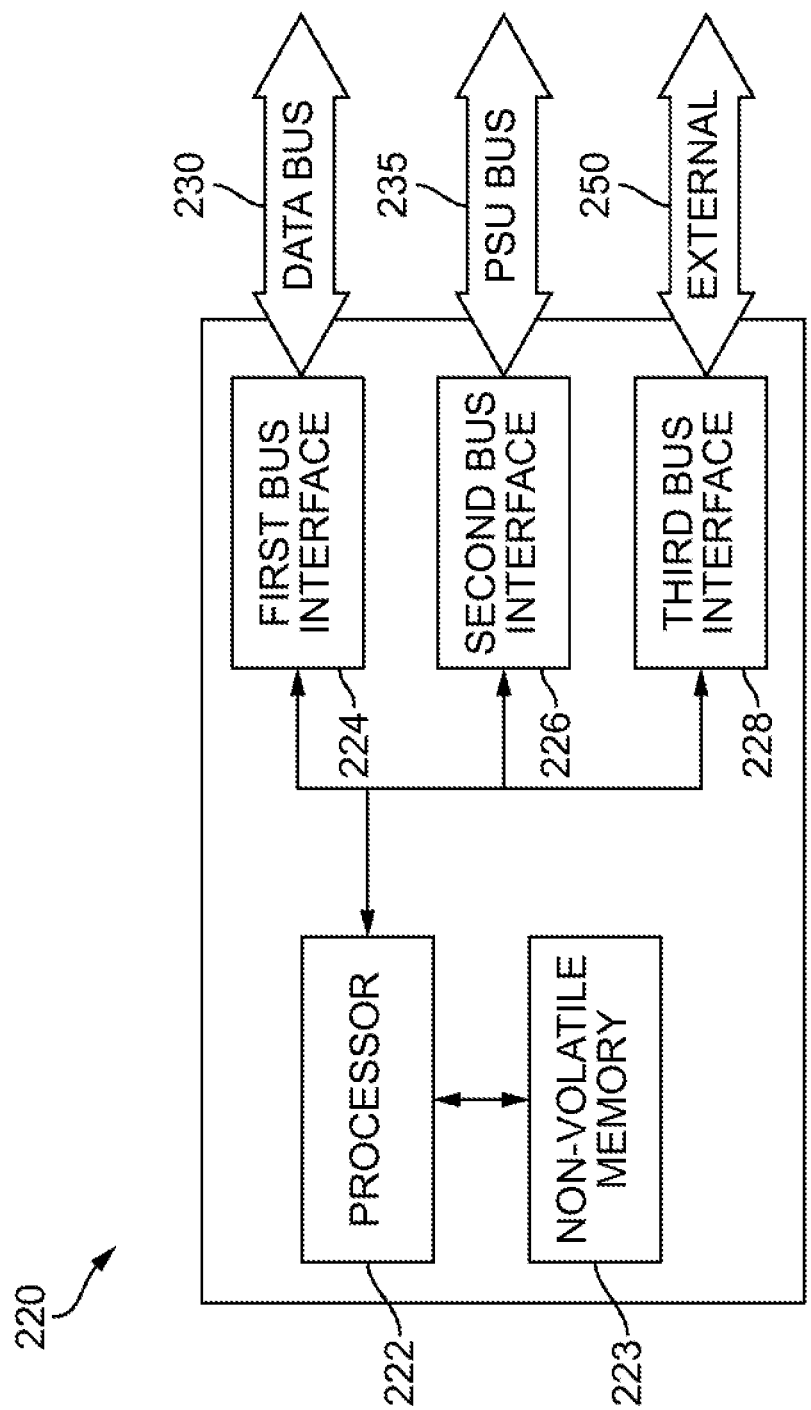
FIG. 2b illustrates an exemplary controller according to the disclosure

FIG. 2b illustrates controller 220, which may include the following components: one or more processors 222 coupled to a non-volatile memory 223; a first bus interface 224 for interfacing with data bus 230; a second bus interface 226 for interfacing with PSU data bus 235; and a third bus interface 228 for connecting to an external network 260 via network connection 250. Non-volatile memory 223 may be encoded with machine-readable instructions that, when executed by the processor 222, implements the processes described below. The non-volatile memory 223 may also be used for storing historical voltage sensor and command voltage data, which is also further described below.

Sensor data bus 230 carries data generated by each voltage sensor 210 to controller 220. Sensor data bus 230 may involve a daisy chain-style connection between controller 220 and each voltage sensor 210 and may be configured as a serial bus whereby a single bus line may connect controller 220 to all of the voltage sensors 210. Further, depending on whether data bus 230 is used to carry additional data to/from each RRH 120 to the external network 260, sensor data bus 230 may be implemented with a fiber optic line, or with a robust but slower connection, such as an RS485 protocol.

Figure 3:
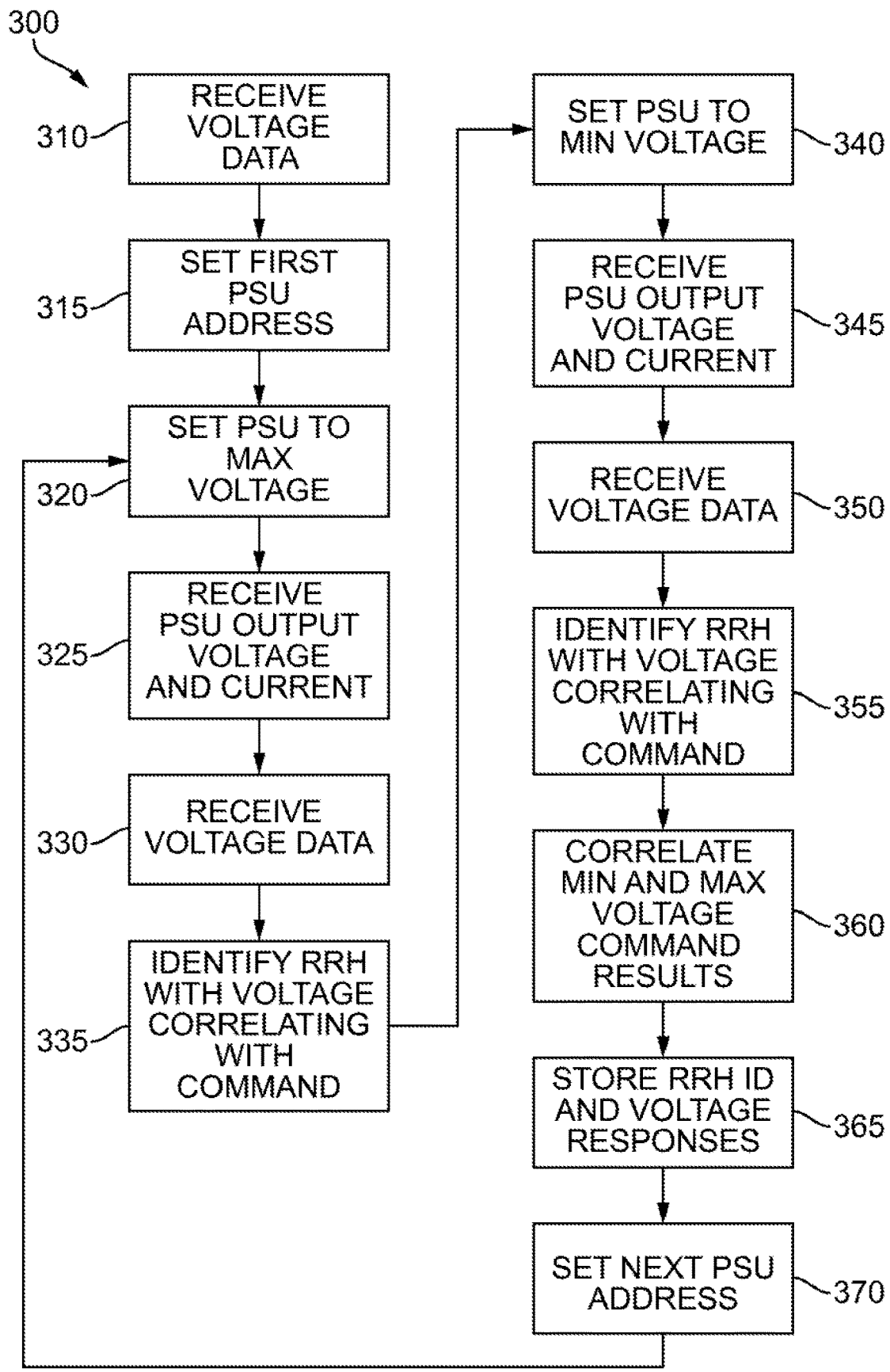
FIG. 3 illustrates an exemplary process for performing an initial RRH/PSU discovery on startup.

FIG. 3 illustrates an exemplary process 300 executed by processor 222 within controller 220 for scanning system 200 to identify the RRHs 120 and their corresponding PSUs 130 to create and store a set of PSU/RRH pairs and store them in non-volatile memory 223.

In step 310, processor 222 executes instructions to receive voltage data from each voltage sensor 210. In doing so, processor 222 receives voltage data streams from each voltage sensor 210 via sensor data bus 230. If voltage sensors 210 transmit packetized data, or data is a specific protocol format, processor 222 retrieves voltage samples from each of the voltage data streams and may buffer the voltage samples, organized by RRH 120. For example, voltage data from a given voltage sensor 210 may be sent on sensor data bus 230 at a rate of once per second. Each voltage sample may or may not have a respective time stamp reflecting the time at which the voltage sample was acquired by voltage sensor 210. It will be understood that various approaches to this are possible and within the scope of the disclosure.

At this stage of process 300. PSUs 130 may be in standby or a similar disabled mode whereby their voltage output is unregulated/uncontrolled.

In step 315, processor 222 executes instructions to set a first PSU address or identifier. In this example in which multiple PSUs 130 are coupled to controller 220, controller 222 may have a table of bus addresses, which may be stored in non-volatile memory 223, by which it may communicate with each individual PSU 130 via second bus interface 226. In this case, controller 222 sets an address corresponding to a first PSU 130.

In step 320, controller 222 issues a command to a first PSU 130 to a predetermined first test voltage and to record the time at which the command was issued. The first test voltage may be equal to the maximum voltage for PSU 130, or it may be a different voltage that would also distinguish its output voltage from the standby state of the other PSUs 130. Processor 222 may further store the commanded voltage, PSU 130 address, and time stamp in non-volatile memory 223.

In step 325, processor 222 receives data from the commanded PSU 130, via PSU data bus 235, the voltage and current output as measured by PSU 130 along with a time stamp. Processor 222 may store these data in non-volatile memory 223.

In step 330, controller 220 receives voltage data from each voltage sensor 210 via sensor data bus 230. This step may be substantially similar to step 310 described above.

In step 335, processor 222 executes instructions to identify which RRH 120 corresponds to the commanded PSU 130 by identifying the voltage sensor 210 that is measuring the responsive increase in voltage. In doing so, processor 222 identifies the voltage sensor 201 (and thus its corresponding RRH 120) and stores it in non-volatile memory 223 along with the commanded voltage and time stamp. Note that one of the voltage sensors 210 would indicate an increase in voltage due to the commanded voltage setting in step 320, but it may be the case that more than one other voltage sensors 210 may indicate an increase in voltage for any reason that might not be connected to the increase in the output of the addressed PSU. If one or more other voltage sensors 210 are indicating a rise in voltage, for whatever reason, processor 222 may identify these corresponding RRHs 120 as well and store the relevant information for all of the corresponding RRHs 120.

In step 340, processor 222 executes instructions to set the first PSU 130 to a second test voltage. In an exemplary embodiment, the second test voltage is the minimum voltage output for PSU 130.

In step 345, controller 220 receives data from the commanded PSU 130, via PSU data bus 235, the voltage and current output as measured by PSU 130 along with a time stamp. Processor 222 may store these data in non-volatile memory 223. Step 345 may be substantially similar to step 325.

In step 350, controller 220 receives, via data bus 230, voltage data from each voltage sensor 210, similarly to steps 310 and 330.

In step 355, processor 222 executes instructions to identify which RRH 120 corresponds to the commanded PSU 130 by identifying the voltage sensor 210 that is measuring a responsive decrease in voltage. In doing so, processor 222 identifies the voltage sensor 201 (and thus its corresponding RRH 120) and stores it in non-volatile memory 223 along with the commanded voltage and time stamp. Note that step 355 may be substantially similar to step 335. Similarly to step 335, it may be the case that more than one voltage sensor 210 indicates a drop on voltage, only one of which in response to the voltage commanded in step 340. In this case, processor 222 will store the data corresponding to each identified RRH 120.

In step 360, processor 222 executes instructions to retrieve the voltages and time stamps stored in steps 330 and 345, and the RRHs identified in respective executions of steps 335 and 355, from non-volatile memory 223. With this data retrieved, processor 222 executes instructions to identify which RRH appears to be responding to both the first test voltage (e.g., maximum voltage) and the second test voltage (e.g., minimum voltage). And in step 365, processor 222 stores the resulting of PSU/RRH combinations in non-volatile memory 223.

In step 370, processor 222 retrieves the address corresponding to the next PSU 230 and sets this address for communication via second bus interface 226.

Under process 300, steps 320-370 are repeated for each PSU 130, and thus for each combination of PSU 130 and corresponding RRH 120, until all of the PSUs 130 have been activated, their corresponding RRHs 120 identified, and their respective PSU/RRH combinations stored.

As mentioned earlier, voltage sensors 210 may be integrated at any point within power cables 140. In this case, there may be a difference between the voltage measured by voltage sensor 210 and the actual voltage applied to RRH 120 at the end of power cable 140. In this case, processor 222 may execute instructions to extrapolate and estimate the voltage at RRH 120 based on the voltage measured by voltage 210, the voltage and current measured by PSU 130, the known cable length from PSU 130 to voltage sensor 210, and the known remaining cable length from voltage sensor 210 to RRH 120.

With each PSU/RRH combination established and characterized, system 200 may run to continually maintain desired voltages at each RRH 120.

Figure 4:
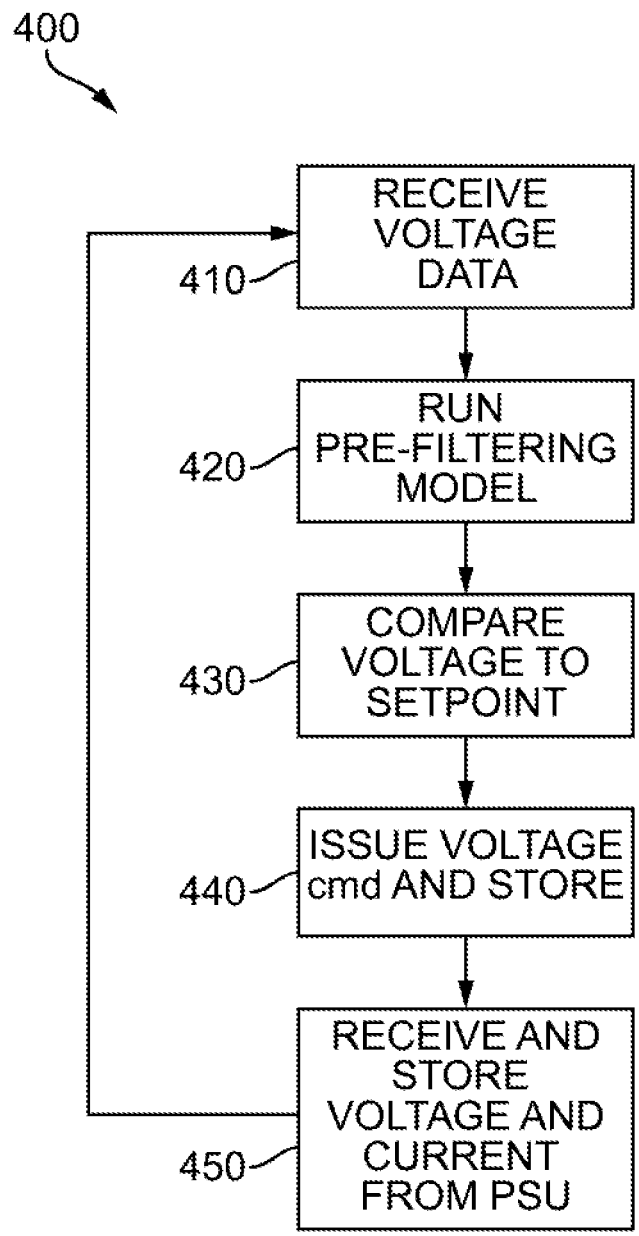
FIG. 4 illustrates an exemplary process for nominal operation of the system in which the PSUs are controlled to provide for desired voltages at the RRHs.

FIG. 4 illustrates an exemplary process 400 by which controller 220 maintains desired setpoint voltages at RRHs 120. Controller 220 may execute process 400 separately for each PSU/RRH combination or may execute each step for all of the PSU/RRH combinations before moving to the next step. It will be understood that such variations to process 400 are possible and within the scope of the disclosure.

In step 410, processor 222 executes instructions to receive voltage data streams from each voltage sensor 210 via sensor data bus 230. Step 410 may be substantially similar to steps 310 and 340 described above.

In step 420, processor 222 executes instructions to pre-filter the voltage data received in step 410. In doing so, processor 222 retrieves historical voltage data and their corresponding timestamps from non-volatile memory 223, implements a digital filtering model to identify past behavior of the voltage signal corresponding to the RRH 120 as measured by its respective voltage sensor 210, and identifies any possible outlier voltage value in the current voltage data. If the pre-filtering implementation identifies the current voltage data as an outlier, processor 222 adjusts or replaces the voltage with a value that is more consistent with the historical behavior of the stored voltage data. It will be understood that many digital filtering algorithms for implementing pre-filtering are possible and within the scope of the disclosure.

In step 430, processor 222 executes instructions to compare the voltage sample corresponding to each RRH 120 with a designated setpoint voltage. Note that the voltage sample, at this stage of process 400, might be the adjusted or replacement voltage computed in pre-filtering step 420. The setpoint voltage is a value that corresponds to a desired voltage at RRH 120. There may be a discrepancy in that the voltage sample (from voltage sensor 210) may be different from the actual voltage at RRH 120, due to the fact that the voltage sensor 210 may be located at a midpoint along power cable 140. In this case step 430 will require a substep in which processor 222 takes the pre-filtered voltage sample and extrapolates what the corresponding voltage would be at RRH 120, in other words, if voltage sensor 210 is placed at some mid-point along power cable 140, processor 222 may execute instructions to retrieve data from non-volatile memory 223 pertaining to the current sensed at the output of PSU 130, the estimated resistance of power cable 140, and the remaining distance from the voltage sensor 210 and the end of power cable 140 at the corresponding RRH 120. With this data, processor 222 may calculate the required voltage offset to compensate for the remaining length of power cable 140. Once processor 222 has calculated the voltage offset and added it to the pre-filtered voltage sample, processor 222 may then execute instructions to compare this value to the voltage setpoint for RRH 120.

In comparing the compensated sensed voltage to the setpoint voltage, processor 222 may execute instructions to adjust the command voltage to restore the sensed voltage to the setpoint voltage. This may be done according to known digital control principles.

Further, given that the length of power cable 140 and its resistance is known and stored in non-volatile memory 223, processor 222 may execute instructions to calculate a command voltage offset, which it may add to the command voltage, to compensate for the estimated voltage drop across power cable 140 between PSH 130 and RRH 120.

Processor 222 may adjust the setpoint voltage for RRH 120 so that the voltage applied to power cable 140 can be increased, and the current from PSU 130 throttled, so that more power may be delivered to RRH 120 with the current remaining controlled. In doing so, PSU 130 may deliver more power to RRH 120 while controlling power dissipation in power cable 140, thereby obviating the need to replace power cable 140 with a cable of greater current capacity.

In step 440, processor 222 issues the command voltage to PSU 130 via PSU data bus 260, and stores the command voltage in non-volatile memory 223.

An additional aspect of the invention is that system controller 220 can detect two types of anomalies: one in which one or more (or all) of the voltage sensors either go down or provide unreliable data; and another in which an RRH 120 was configured or reconfigured incorrectly in the field. In the latter case, controller can maintain proper operation of PSU 130 providing power to RRH 120. These anomalies are identified and mitigated in the process described below.

Figure 5:
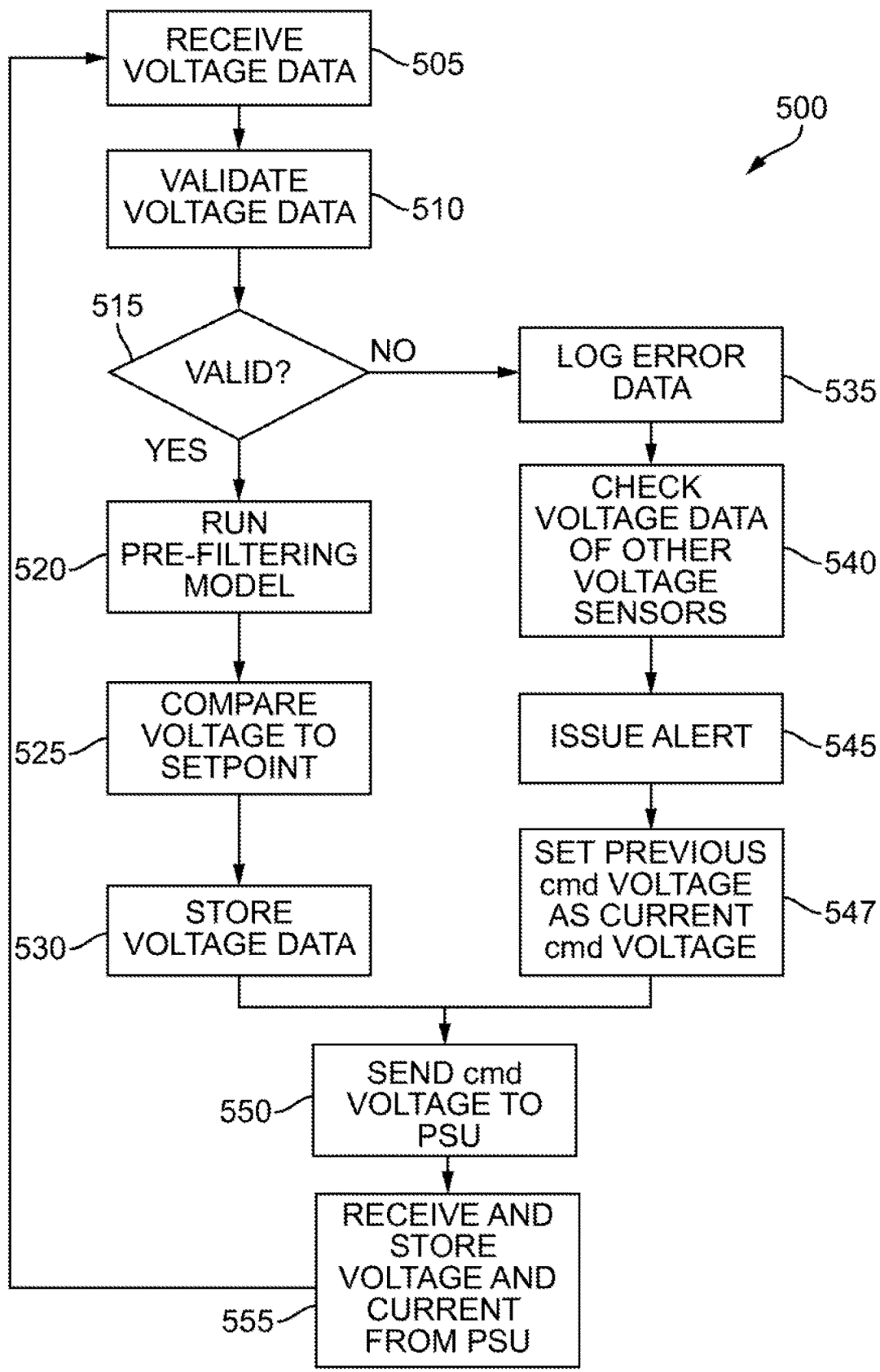
FIG. 5 illustrates an exemplary process for monitoring and controlling the voltages for the PSUs, as well as monitoring for power anomalies and providing for robust power control in the event of an anomaly.

FIG. 5 illustrates an exemplary process 500 for robust operation of system 200 via the functions of controller 220.

In step 510, processor 222 receives voltage data streams from each of the voltage sensors 210 in a manner substantially similar to steps 310, 330, and 350 of process 300.

In step 515 processor 222 executes instructions to validate the incoming voltage samples. In doing so, processor 222 may buffer the voltage samples from each voltage sensor 210 and compare them with a respective active voltage range. The active voltage range may be a range of voltages that would be consistent with proper operation of the RRH 120 as well as proper function of voltage sensor 210. If the voltage sample lies within that range, process 500 proceeds via decision gate 515 to step 520, in which processor 222 stores the voltage sample and its time stamp in non-volatile memory 223.

Following process 500 onward through steps 520-555, processor 222 performs functions substantially similar to steps 420-450 of process 400 in FIG. 4.

Returning to decision gate 515, in the event that the voltage sample lies outside the active voltage range, then process 500 proceeds to step 535, in which processor 222 executes instructions log error data in non-volatile memory 223. Error data may include the voltage value received in step 505 along with time stamp, the identity of the PSU 130 and RRH 120.

In step 540, processor 222 executes instructions to determine whether any of the voltage samples corresponding to other RRH/PSU pairs are also outside their respective active voltage ranges. In doing so, step 540 may include multiple iterations of steps 505 and 510 for the other voltage sensors 210. Alternatively, step 540 may be omitted and the status of the other voltages will be subsequently determined when controller 220 executes process 500 for the other PSU/RRH pairs.

In step 545, processor 222 executes instructions to issue an alert to external network 260 via third bus interface 228.

In step 547, processor 222 executes instructions to retrieve the previously commanded voltage (as done in a previous iteration of process 500) and sets this value as the commanded voltage to be issued to the PSU 130. In this case, controller 222 prevents an anomalous voltage reading from causing an instability or an improper voltage command to the PSU 130.

In a variation of process 500, validation step 515 and subsequent steps 535-547 may be incorporated into step 520. In this case, this modified version of process 500 may appear similar to process 400, but with the run pre-filtering model step 420 incorporating the validation and possible voltage replacement with the previous voltage as described above with reference to steps 515 and 535-547. However, in the event that the voltage sample lies outside the active voltage range, then the process may bypass the pre-filtering step described above and simply replace the new command voltage with the previous command voltage.

Figure 6:
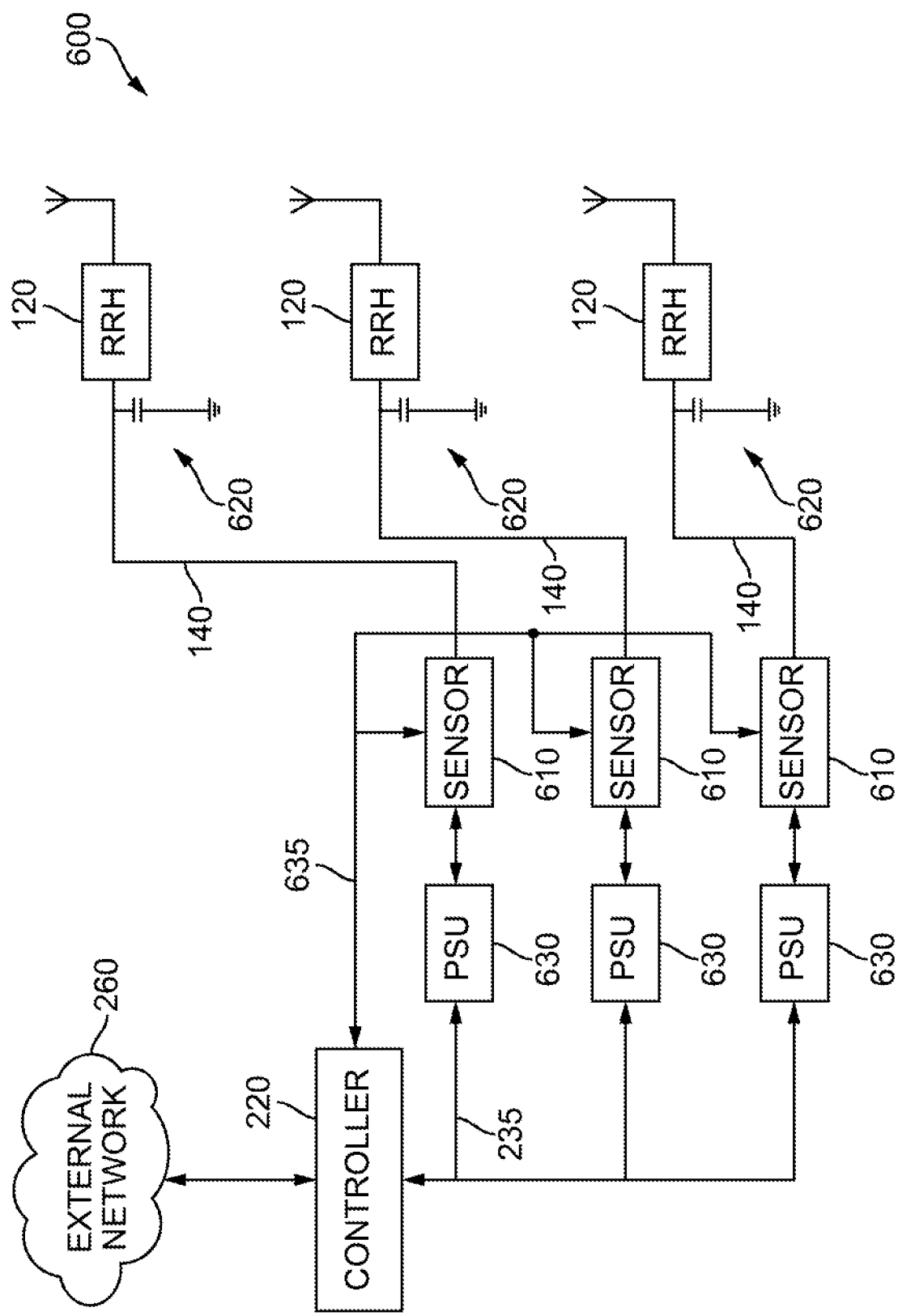
FIG. 6 illustrates a second exemplary power control system according to the disclosure.

FIG. 6 illustrates another embodiment of the disclosed system 600. Exemplary system 600 includes one or more PSUs 630, each of which provides power via a respective power cable 140 to a corresponding RRH 120. System 600 also includes a controller 220. All of these components may be substantially similar to the like-numbered components in FIG. 2a. System 600 also includes a sensor 610 coupled to each PSU 630 and the controller 220. Further illustrated are parasitic capacitances 620, each of which may be individually characteristic of its respective RRH 120. Please note that parasitic capacitances 620 are inherent to the given RRH 120, and are not separate dedicated capacitors specifically coupled to the RRH 120 at the connection to power cable 140.

Sensor 610 is a current sensing device that measures the current in power cable 140. It may also sense the voltage output at PSU 630. Controller 220 may communicate with each sensor 610 via a sensor data bus 635. Sensor data bus 635 may be implemented according to any known instrumentation serial bus standards, or alternatively via an Ethernet connection. Preferably, each sensor 610 should be located in close proximity to its corresponding PSU 630. Alternatively, sensor 610 may be integrated into PSU 630.

Controller 220 communicates to each PSU 630 via PSU data bus 235, in a manner substantially similar to system 200 in FIGS. 2a and 2b. In a further variation, PSU data bus 235 and sensor data bus 635 may be a single serial bus. It will be readily understood that such variations are possible and within the scope of the disclosure.

PSU 630 may differ from PSU 130 of FIG. 2a in that PSU 630 is configured to operate in a mode in which it can output a signal of a single frequency at a time, whereby the frequency can be controlled so that PSU 630 can output a single frequency signal for a specific duration, and then do the same at a different frequency. In doing this in a sequence, PSU 630 can transmit a sequence of single frequency pulses at, for example, incrementally increasing frequencies from a minimum frequency to a maximum frequency (a successive frequency pulse sequence), in an alternative example, sensor 610 may be have an additional subsystem that provides this successive frequency pulse sequence, instead of PSU 630.

Figure 7:
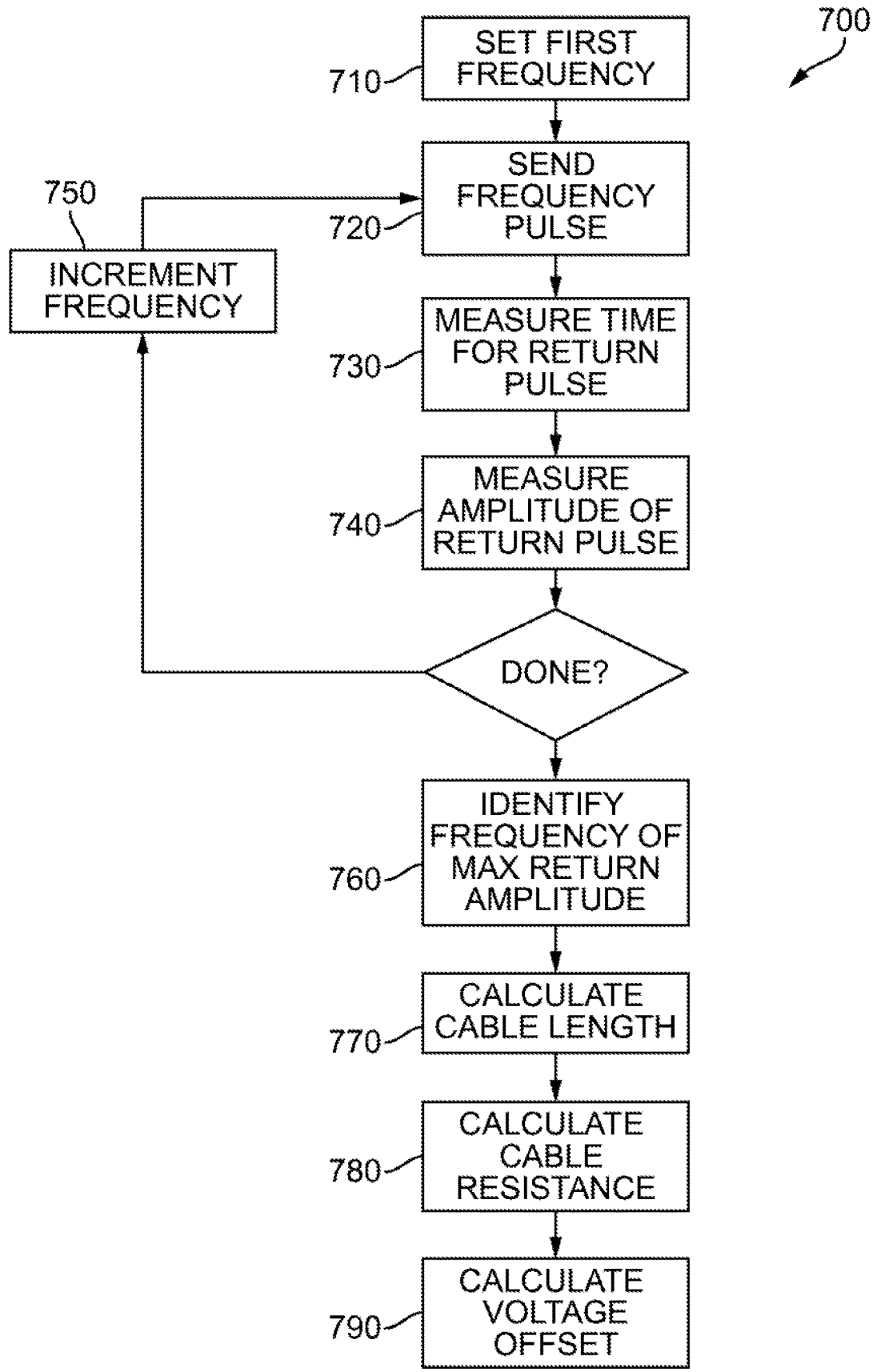
FIG. 7 illustrates an initial system characterization process that may be executed by the system of FIG. 6.

FIG. 7 illustrates an exemplary process 700 by which system 600 characterizes each combination of power cable 140 and parasitic capacitance 620. With this complete, controller 220 can command each PSU 630 to output a specific voltage that will result in a desired voltage at the remote connection between power cable 140 and RRH 120. Controller 220 may execute process 700 on startup, as well as at other times after any maintenance or servicing in which one or more RRHs 120 are powered down. Similar to process 400, processor 222 may execute process 700 once per individual PSU 630, thus in one iteration per PSU 630. Alternatively, processor 222 may execute each step of process 700 for each and all PSUs 630 before proceeding to the next step. It will be readily apparent that such variations to process 700 are possible and within the scope of the disclosure.

In step 710, controller 220 sets each PSU 630 to output an AC voltage at a predefined frequency. This is the first frequency of the successive frequency pulse sequence, each of which may be stored in non-volatile memory 223 and retrieved by processor 222. Controller 220 sends a command to each PSU 630 to output a pulse of specific duration at this frequency. For example, controller 220 may command each PSU 630 to issue a sequence 10 pulses per frequency, from frequencies ranging from 1 Hz to 10 MHz on a logarithmic scale, and at an amplitude of substantially 5 Vpp. The pulse duration would vary with frequency.

In step 720, PSU 630 transmits a pulse at the set frequency. Sensor 610 measures the current and voltage of the output of PSU 630 and continues to monitor power cable 140 for a returned pulse.

In step 730 and 740, if sensor 610 detects a returned (reflected) pulse, it measures the time between the transmission of the pulse and the arrival of the reflected pulse, and the amplitude of the reflected pulse. Sensor 610 then transmits the return time and the measured amplitudes to controller 220, whereby processor 222 stores the data in non-volatile memory 223.

If there is another frequency to transmit, processor 222 executes instructions to increment the frequency, or otherwise step to the next frequency, and repeat steps 720-740. Once steps 720-740 have been executed for all of the frequencies, processor 222 executes instructions to identify the frequency that yielded the highest amplitude return, and retrieve the return time corresponding to that frequency. With this information, in step 770, processor 222 may calculate the length of the transmission path through power cable 140. Once the length of the power cable 140 is known, then given the gauge of the power cable 140 (which is also known), in step 780 processor 222 then calculates the total resistance of the transmission path. Processor 222 then calculates the required voltage offset that controller 220 must command PSU 630 to output in order to provide the desired voltage at the end of power cable 140 at the RRH 120. Processor 222 may then store the resistance and the voltage offset corresponding to the specific PSU/cable/RRH combination.

With this done, system 600 may execute appropriately modified versions of processes 400 and/or 500.

In another exemplary embodiment, system 600 may have a variation in which the power cables 140 are characterized by generating a set of VI factors for each cable, as opposed to testing at different frequencies. In this case, each sensor 610 may be an inductive current sensor, which measures the current in power cable 140.

This embodiment may include a test mode, in which controller 220 sets different command voltages for each PSU 630. For each voltage setting, sensor 610 measures the current through each respective power cable 140 and a temporary voltage sensor (not shown) measures the voltage at the input to each RRH 120. In this test mode, controller 220 cycles through a series of voltages and records the commanded voltages, sensed currents, and sensed RRH voltages in non-volatile memory 223. In doing so, controller 220 has established a set of VI factors for operational control of the voltage at each RRH.

In nominal operation of system 600 according to this embodiment, controller 220 sets the voltage at each PSU 630 to the voltage corresponding to the desired voltage at each RRH 120 and monitors the current in each power cable 140 via respective sensor 610. Depending on the sensed current, processor 222 in controller 220 may adjust the commanded voltage so that the combination of commanded voltage and sensed current corresponds to the proper voltage at RRH 120. If power demand increases in RRH 120, PSU 630 may compensate in order to keep the commanded voltage constant. In this case, processor 222 may increase the voltage to be set to PSU 120 in order to compensate for the increase in power demand by increasing the voltage and keeping the current substantially constant. In doing so, the voltage at RRH 120 is maintained, and the current in power cable 140 is also controlled so that the loss in power cable 140 does not increase.

It will be understood that variations to system 200 are possible and within the scope of the disclosure. For example, although three pairs of PSUs 130 and RRHs 120 are illustrated, any reasonable number of RRHs 120 and PSUs 130 may be employed. Further, a single PSU 130 may provide power to more than one RRH 120. Also, data bus 230 may be integrated into power cable 240 such that it is a hybrid cable that provides both power and data connectivity between a PSU 130 and its corresponding RRH(s) 120. Similarly, sensor data bus 230 and PSU data bus 235 may comprise a single serial bus, in which case first and second bus interfaces 224 and 226 may be a single interface bus.

What is claimed is:

1. A system for controlling power to a cell tower, comprising:
   a plurality of tower top equipment units, each of the tower top equipment units having a remote radio head and a corresponding voltage sensor;
   a plurality of power supply units; and
   a controller coupled to the voltage sensors and a purality of power supply units, wherein the controller is configured to receive a plurality of voltage samples from each of a plurality of voltage sensors, the voltage samples corresponding to power provided by each of the power supply units to a corresponding remote radio head, pre-filter each voltage sample, and issue a voltage command to each of the power supply units, wherein each voltage command corresponds to a pre-filtered voltage sample
   wherein the controller is configured to perform a discovery scan between each of the the power supply units and the tower top equipment units, the discovery scan comprising the steps of:
   commanding a first power supply unit to generate a first test voltage;

receiving a first plurality of voltage samples from the plurality of voltage sensors;

commanding the first power supply unit to generate a second test voltage;

receiving a second plurality of voltage samples from the plurality of voltage sensors;

identifying a first tower top equipment unit by identifying a responsive voltage sensor that responds to the first test voltage in the first plurality of voltage samples, and responds to the second test voltage in the second plurality of voltage samples; and storing an identifier corresponding to the first power supply unit and an identifier corresponding to a first remote radio head.

2. The system of claim 1, wherein the first test voltage comprises a maximum voltage, and the second test voltage comprises a minimum voltage.

3. The system of claim 1 wherein the identifier corresponding to the first power supply unit comprises a bus address.

4. The system of claim 1 wherein the discovery scan further comprises:

commanding a second power supply unit to generate a maximum voltage;

receiving a third plurality of voltage samples from the plurality of voltage sensors;

commanding the second power supply unit to generate a minimum voltage;

receiving a fourth plurality of voltage samples from the plurality of voltage sensors;

identifying a second tower top equipment by identifying a responsive voltage sensor that responds to the maximum voltage in the third plurality of voltage samples, and responds to the minimum voltage in the fourth plurality of voltage samples; and storing an identifier corrsponding to the second power supply unit and an identifier corresponding to a second remote radio head.

5. The system of claim 1, wherein the discovery scan further comprises the steps of filtering of each voltage data sample which further comprises the steps of:

comparing an incoming voltage sample with an active voltage range;

if the incoming voltage sample is within the active voltage range, pre-filtering the incoming voltage sample, comparing the pre-filtered incoming voltage sample with a voltage setpoint, and storing the pre-filtered incoming voltage sample; and if the incoming voltage sample is outside the active voltage range, issuing an alert, and retrieving a previous pre-filtered voltage sample and storing the previous pre-filtered voltage sample as the pre-filtered incoming voltage sample.

6. The system of claim 5, further comprising a plurality of power supply units coupled to a respective plurality of remote radio heads by a plurality of power cables, configured to perform the steps of:

a) setting the first power supply unit to a first frequency;
b) sending an output pulse at the first frequency;
c) measuring a return time for a return pulse corresponding to the output pulse;
d) measuring an amplitude of the return pulse;
e) repeating steps a) d) for a plurality of frequencies;
f) identifying a matching frequency corresponding to the highest amplitu de return pulse;
g) calculating a power cable length based on the return time corresponding to the matching frequency;
h) calculating a power cable resistance based on the power cable length; and
i) calculating an offset voltage based on the power cable resistance.

7. The system of claim 6, wherein the plurality of frequencies comprises a range from 1 Hz to 10 MHz in a logarithmic scale.

8. The system of claim 1, wherein each of the power supply units is coupled to a respective tower top equipment unit by a power cable, and further comprises: an inductively coupled sensor coupled to its respective power cable; the controller coupled to the plurality of power supply units and its corresponding inductively coupled sensor, the controller having a procesor and a non-volatile machine readable memory encoded with instructions for operating in a test mode and an operation mode, wherein the test mode includes setting a series of voltages at each of the plurality of power supply units, measuring a resulting current with a corresponding inductively coupled sensor and calculating a VI factor corresponding to each voltage and the resulting current, and wherein the operation mode includes setting each of the power supply units to a control voltage in response to a sensed current, wherein the control voltage is a function of the sensed current and a respective VI factor.

9. The system of claim 8, wherein the inductively coupled sensor comprises an inductive current sensor.

10. The system of claim 6, wherein the output pulse comprises an amplitude of 5Vpp.

11. The system of claim 9, wherein the inductively coupled sensor comprises an inductive voltage sensor.

12. The system of claim 11, wherein the inductively coupled sensor comprises the inductive current sensor and an inductive voltage sensor.

13. The system of claim 12, wherein the inductively coupled sensor is coupled to its respective power cable at a top of the power cable, proximate to the tower top equipment.

14. The system of claim 13, wherein the inductively coupled sensor is coupled to its respective power cable proximate to at least one of the plurality of power supply units.

\* \* \* \* \*